(12) United States Patent
Kummerl

(10) Patent No.: US 10,887,993 B2
(45) Date of Patent: Jan. 5, 2021

(54) STANDOFF CONNECTOR FOR ELECTRICAL DEVICES

(71) Applicant: TEXAS INSTRUMENTS INCORPORATED, Dallas, TX (US)

(72) Inventor: Steven Kummerl, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 35 days.

(21) Appl. No.: 14/985,760

(22) Filed: Dec. 31, 2015

(65) Prior Publication Data

US 2017/0196090 A1  Jul. 6, 2017

(51) Int. Cl.
*H05K 1/18* (2006.01)
*H01R 43/20* (2006.01)

(52) U.S. Cl.
CPC .......... *H05K 1/181* (2013.01); *H01R 43/205* (2013.01); *H05K 2201/1031* (2013.01); *H05K 2201/10515* (2013.01); *Y02P 70/50* (2015.11)

(58) Field of Classification Search
CPC .......... H05K 1/181; H05K 2201/1031; H01R 43/205
See application file for complete search history.

(56) References Cited

U.S. PATENT DOCUMENTS

| | | | | |
|---|---|---|---|---|
| 6,163,460 A * | 12/2000 | Baur | ............ | H01G 2/04 361/752 |
| 6,268,662 B1 * | 7/2001 | Test | ............ | H01L 24/11 257/784 |
| 7,791,901 B2 * | 9/2010 | Sailor | ............ | H01G 2/04 361/807 |
| 8,076,769 B2 * | 12/2011 | Nishimura | ............ | H05K 1/0275 257/688 |
| 2005/0133928 A1 * | 6/2005 | Howard | ............ | H01L 24/11 257/773 |
| 2007/0228110 A1 * | 10/2007 | Eldridge | ............ | B23K 20/004 228/180.5 |
| 2013/0265731 A1 * | 10/2013 | Holma | ............ | H05K 1/181 361/772 |
| 2017/0194233 A1 * | 7/2017 | Castro | ............ | H01L 23/28 |
| 2019/0291204 A1 * | 9/2019 | Sijelmassi | ............ | H01L 24/45 |

* cited by examiner

*Primary Examiner* — Nathan Milakovich
(74) *Attorney, Agent, or Firm* — Ronald O. Neerings; Charles A. Brill; Frank D. Cimino

(57) ABSTRACT

An apparatus includes an electrical device having a surface. The electrical device includes a first surface conductor spaced apart from a second surface conductor on the surface to provide circuit contacts to the device. A first standoff connector is bonded to the first surface conductor. The first standoff connector includes a leg having a proximal end bonded to the first surface conductor. The leg of the first standoff connector extends outwardly from the first surface conductor to a bend that is spaced apart from the surface of the electrical device. A second standoff connector is bonded to the second surface conductor. The second standoff connector includes a leg having a proximal end bonded to the second surface conductor. The leg of the second standoff connector extends outwardly from the second surface conductor to a bend that is spaced apart from the surface of the electrical device.

27 Claims, 3 Drawing Sheets

STANDOFF CONNECTOR FOR ELECTRICAL DEVICES

TECHNICAL FIELD

This disclosure relates to integrated circuits, and more particularly to a standoff connector that is bonded to a surface conductor of an electrical device.

BACKGROUND

Increasing integrated circuit density is an ever-increasing necessity for modern electronic systems where more components are needed in smaller spaces. One technique for increasing circuit density involves the use of surface-mount technology (SMT) for producing electronic circuits in which the components are mounted or placed directly onto the surface of printed circuit boards (PCBs). An electronic device made for such mounting is referred to as a surface-mount device (SMD). In the industry, SMD has largely replaced through-hole technology construction methods of fitting components with wire leads into holes in the circuit board. Both technologies can be used on the same board, with the through-hole technology used for components not suitable for surface mounting such as large transformers and heat-sinked power semiconductors, for example.

While SMT enables increasing the density of electronic systems, this only attacks the problem in two-dimensional space. In some systems, devices need to be stood-off from the PCB such as for thermal issues, for example. Also, by mounting devices off the PCB, other PCB real estate can be freed for other purposes. Conventional stand-off mounting techniques are expensive and often involve complex multi-stage manufacturing processes. For example, a mechanical standoff needs to first be fabricated as a separate component from the device to which it is connected. Then, complex connections such as screws or other mounting connection needs to connect the electrical device to the standoff. Finally, connections to both the standoff and the electrical device need to be made to couple the standoff and the device to the PCB. Such complexity is an expensive and time-consuming process.

SUMMARY

This disclosure relates to a standoff connector that is bonded to a surface conductor of an electrical device.

In one aspect, an apparatus includes an electrical device having a surface. The electrical device includes a first surface conductor spaced apart from a second surface conductor on the surface to provide circuit contacts to the device. A first standoff connector is bonded to the first surface conductor. The first standoff connector includes a leg having a proximal end bonded to the first surface conductor. The leg of the first standoff connector extends outwardly from the first surface conductor to a bend that is spaced apart from the surface of the electrical device. A second standoff connector is bonded to the second surface conductor. The second standoff connector includes a leg having a proximal end bonded to the second surface conductor. The leg of the second standoff connector extends outwardly from the second surface conductor to a bend that is spaced apart from the surface of the electrical device.

In another aspect, a method includes fabricating a first surface conductor apart from a second surface conductor on a surface of an electrical device to provide circuit contacts to the device. The method includes bonding a first standoff connector to the first surface conductor. The first standoff connector includes a leg having a proximal end bonded to the first surface conductor. The leg of the first standoff connector extends outwardly from the first surface conductor to a bend that is spaced apart from the surface of the electrical device. The method includes bonding a second standoff connector to the second surface conductor. The second standoff connector includes a leg having a proximal end bonded to the second surface conductor. The leg of the second standoff connector extends outwardly from the second surface conductor to a bend that is spaced apart from the surface of the electrical device.

In yet another aspect, a system includes an electrical device having a surface. The electrical device includes a first surface conductor spaced apart from a second surface conductor on the surface to provide circuit contacts to the device. A first standoff connector is bonded to the first surface conductor. The first standoff connector includes a leg having a proximal end bonded to the first surface conductor. The leg of the first standoff connector extends outwardly from the first surface conductor to a bend that is spaced apart from the surface of the electrical device. A second standoff connector is bonded to the second surface conductor. The second standoff connector includes a leg having a proximal end bonded to the second surface conductor. The leg of the second standoff connector extends outwardly from the second surface conductor to a bend that is spaced apart from the surface of the electrical device. The system includes a printed circuit board (PCB) to mount the electrical device. The electrical device is coupled to the PCB via the first and second standoff connector. The electrical device is mounted at a mounting distance from the PCB defined by the distance that the legs extend outwardly from the first and second standoff connectors respectively. The mounting distance provides a spatial volume underneath the electrical device to mount at least one other electrical device onto the PCB.

DETAILED DESCRIPTION

This disclosure relates to a standoff connector that is bonded to a surface conductor of an electrical device (e.g., a surface-mount device (SMD)). Standoff connectors can be bonded at ends of an electrical device, such as to opposing ends of a surface mounted resistor, capacitor, inductor, transistor, or integrated circuit, for example. The connectors can be bonded via wire or ribbon-bonding techniques, for example, during fabrication of the electrical device which mitigates costly multi-stage assembly for conventional standoff mounting techniques. When mounted to a printed circuit board (PCB), the standoff connectors hold the electrical device at a mounting distance from the surface of the PCB such that a spatial volume is created between the PCB and the electrical device. As a result, other electrical components can thus be mounted in the spatial volume to increase the integrated circuit density of a printed circuit board for example. The length of the standoff connectors can be adjusted to set a suitable spatial volume to accommodate a range of different components according to application requirements.

In one aspect, the electrical device can have a surface where a first surface conductor can be fabricated apart from a second surface conductor on the surface to provide circuit contacts to the device. A first standoff connector can be bonded during fabrication to the first surface conductor. The first standoff connector includes a leg having a proximal end bonded to the first surface conductor. The leg of the first standoff connector extends outwardly from the first surface conductor to a bend that is spaced apart from the surface of the electrical device. A second standoff connector can be similarly fabricated at opposite (or diagonal) ends of the electrical device. The electrical device can be installed with a system that includes a PCB to mount the electrical device. The electrical device can be coupled to the PCB via the first and second standoff connectors. The electrical device can be mounted at a mounting distance from the PCB defined by the distance that the legs extend outwardly from the first and second standoff connectors respectively. The mounting distance provides a spatial volume underneath the electrical device to mount at least one other electrical device onto the PCB (e.g., via surface mount, through-hole or other mounting technology).

Figure 1:
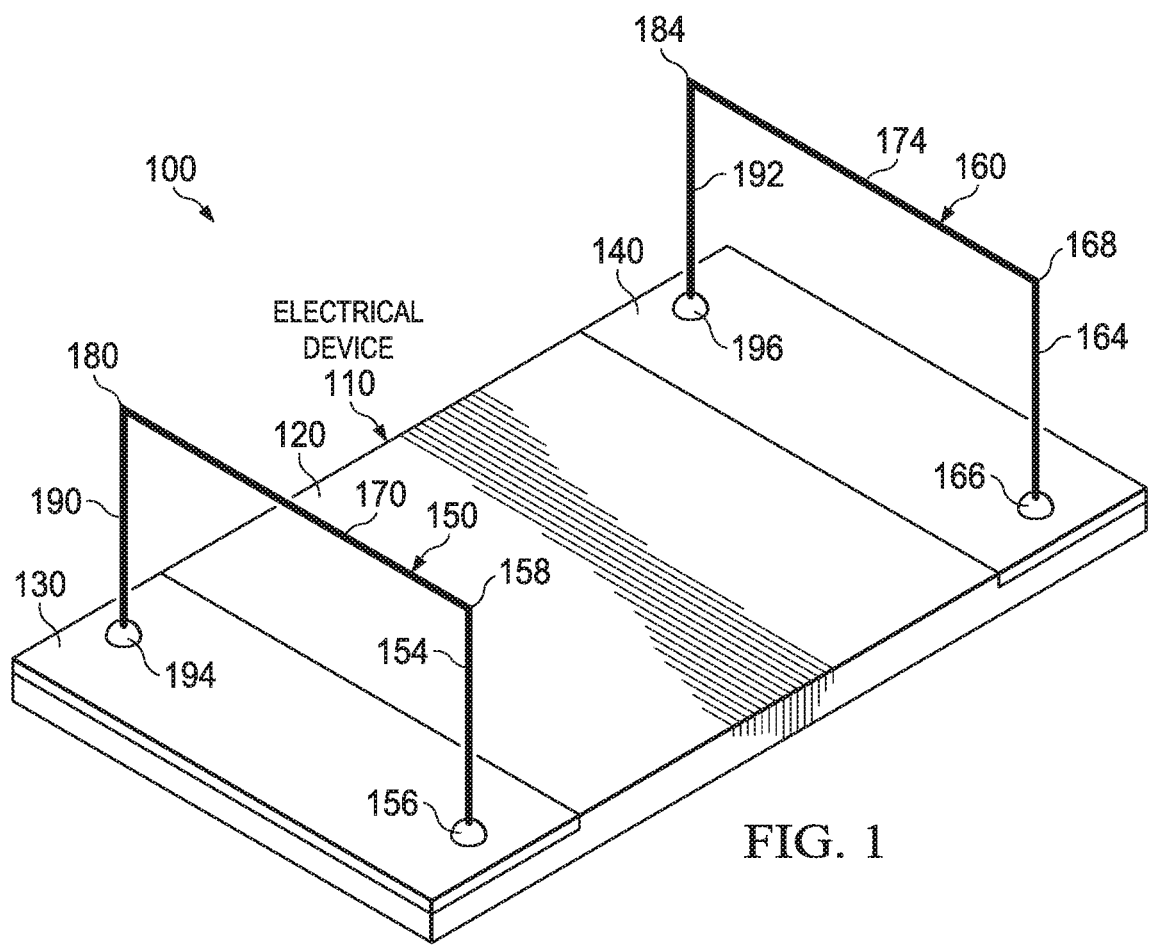
FIG. 1 illustrates an example apparatus that employs standoff connectors that are bonded to surface conductors of an electrical device.

FIG. 1 illustrates an example apparatus 100 that employs standoff connectors that are bonded to surface conductors of an electrical device 110 having a surface 120. The electrical device 110 includes a first surface conductor 130 spaced apart from a second surface conductor 140 on the surface 120 to provide circuit contacts to the device. As used herein, the term circuit can include a collection of active and/or passive elements that perform a circuit function, such as an analog circuit, digital circuit or control circuit, for example. The term circuit can also include an integrated circuit where all the circuit elements are fabricated on a common substrate, for example. A first standoff connector 150 is bonded to the first surface conductor 130. The first standoff connector 150 includes a leg 154 having a proximal end 156 bonded to the first surface conductor 130. The leg 154 of the first standoff connector 150 extends outwardly from the first surface conductor 130 to a bend 158 that is spaced apart from the surface 120 of the electrical device 110. A second standoff connector 160 is bonded to the second surface conductor 140. The second standoff connector 160 includes a leg 164 having a proximal end 166 bonded to the second surface conductor 140. The leg 164 of the second standoff connector 160 extends outwardly from the second surface conductor 140 to a bend 168 that is spaced apart from the surface 120 of the electrical device 110.

The first standoff connector 150 and the second standoff connector 160 can be bonded at opposite ends of the surface 120 of the electrical device 110, in one example, or at other ends in another example. The electrical device 110 can be substantially any type of surface-mount device including a resistor, capacitor, inductor, active device, or integrated circuit, for example. The first standoff connector 150 and the second standoff connector 160 can be fabricated from materials that include copper or gold, palladium-coated copper or gold, or nickel-coated copper or gold, for example. The bend 158 and 168 of the first and second standoff connector 150 and 160 respectively are connected to an intermediate portion 170 and 174 of the first and second standoff connectors 150 and 160.

As shown in the example of FIG. 1, each bend 158 and 168 connects to at least one other bend 180 and 184 via the intermediate portions 170 and 174 of each respective standoff 150 and 160. A corresponding leg 190 and 192, having a proximal end 194 and 196 bonded to at least one other portion of the first and second surface conductors 130 and 140, respectively, connects each bend 180 and 184 back to its respective surface conductors. In this example, each of the standoffs 150 and 160 thus provides an open structure over the respective surface conductor 130 and 140 to which it has been bonded such as to provide an opening between the standoff and the surface of the electrical device 110. Bonding, as described herein, can be performed via ribbon and/or wire bonding techniques, such as ultrasonic welding, thermocompression bonding, thermosonic bonding, wedge bonding and/or direct point flame-off welding. As will be illustrated and described below with respect to FIGS. 3 through 10, the first and second standoff connectors 150 and 160 can be fabricated in various shapes including loops, rectangles, inclined shapes, and so forth.

Figure 2:
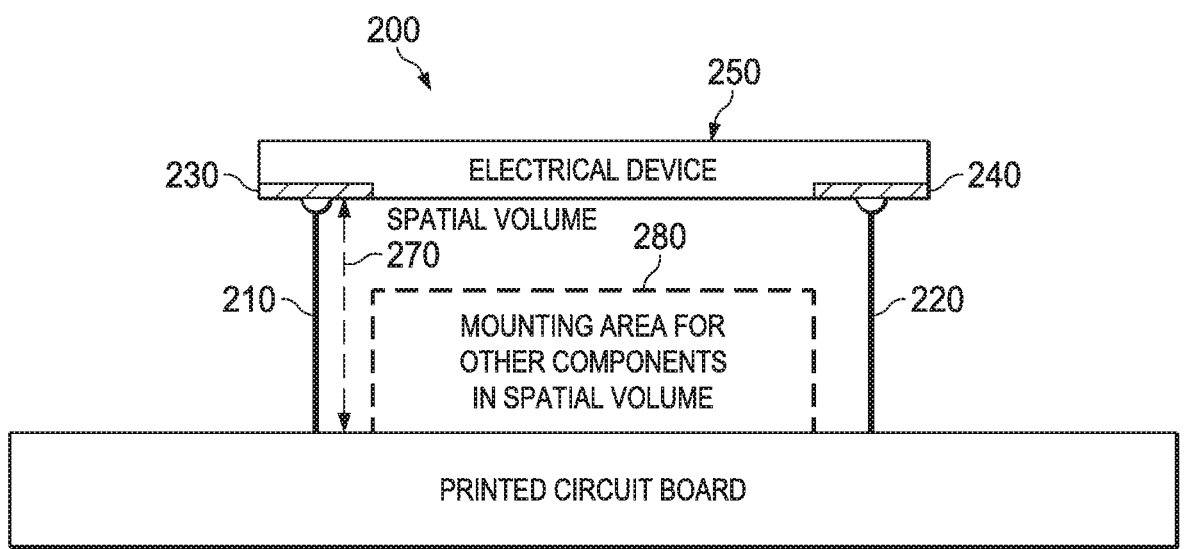
FIG. 2 illustrates an example system that employs standoff connectors that are bonded to surface conductors of an electrical device to facilitate mounting of other components underneath the device on a printed circuit board.

FIG. 2 illustrates an example system 200 that employs standoff connectors 210 and 220 that are bonded to surface conductors of an electrical device 250 to facilitate mounting of other components underneath the device on a printed circuit board 260. The electrical device 250 is coupled to the PCB 260 via the first and second standoff connectors 210 and 220. The electrical device 250 is mounted at a mounting distance shown at dotted arrow 260 from the PCB defined by the distance that the legs extend outwardly from the first and second standoff connectors 210 and 220 respectively. The mounting distance 270 provides a spatial volume underneath the electrical device 250 to mount at least one other electrical device into a mounting area 280 onto the PCB 260. As used herein, the term underneath is a relative term describing the spatial relationship between the electrical device 250 and the area of the PCB 260 residing over which the device is mounted. Thus, if the PCB were mounted vertically instead of horizontally as shown, the mounting area 280 would be spaced horizontally between the PCB 260 and the electrical device 250.

FIGS. 3 through 10 illustrate alternative examples of standoff connector configurations that are bonded to surface conductors of an electrical device. In the examples of FIGS. 3 through 10, the standoff connectors are shown for a single surface conductor. It is understood that typically a given electrical device includes two or more such standoff connectors each bonded to a surface conductor disposed along a respective edge of the electrical device.

Figure 3:
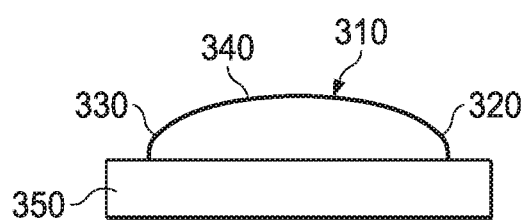
FIGS. 3 through 10 illustrate alternative examples of standoff connector configurations that are bonded to surface conductors of an electrical device.

FIG. 3 illustrates a side view of a standoff connector 310 that is formed as an arcuate loop. The standoff connector 310 includes legs 320 and 330 that are connected via an intermediate portion 340. Each of the legs 320 and 330 are bonded to a surface conductor 350. The loop includes bends that are interconnected above the surface conductor by a corresponding intermediate portion.

Figure 4:
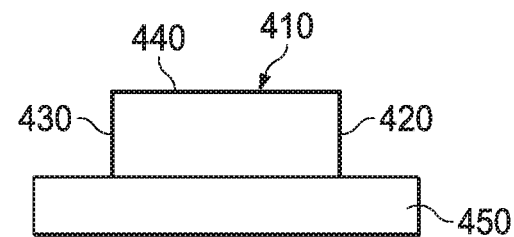

FIG. 4 illustrates a side view of a standoff connector 410 that is formed as a rectangle (or square), similar to the example of FIG. 1. The standoff connector 410 includes legs 420 and 430 that are connected via an intermediate portion 440. Each of the legs 420 and 430 are bonded to a surface conductor 350.

Figure 5:
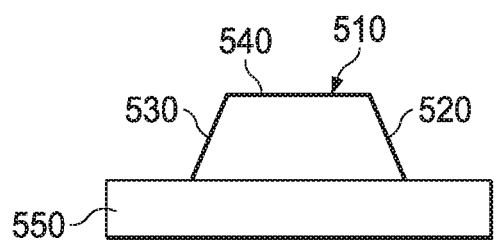

FIG. 5 illustrates a side view of a standoff connector 510 that is formed from legs that are fabricated at inclined angles with respect to the surface. The standoff connector 510 includes legs 520 and 530 that are connected via an intermediate portion 540. Each of the legs 520 and 530 are bonded to a surface conductor 550. In this example, the legs are inclined toward each other, providing a trapezoidal shape having a larger base at the surface conductor 550 than at the intermediate portion that is spaced apart therefrom.

Figure 6:
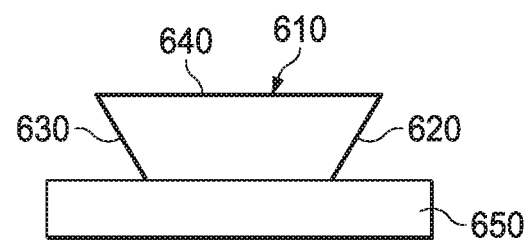

FIG. 6 illustrates a side view of an alternative standoff connector 610 from that depicted in FIG. 5 that is formed from legs that are fabricated at inclined angles. The standoff connector 610 includes legs 620 and 630 that are connected via an intermediate portion 640. Each of the legs 620 and 560 are bonded to a surface conductor 650. In this example, the legs are inclined away from each other providing a trapezoidal shape having a smaller length base at the surface conductor 550 than at the intermediate portion 640 that is spaced apart from the surface conductor.

Figure 7:
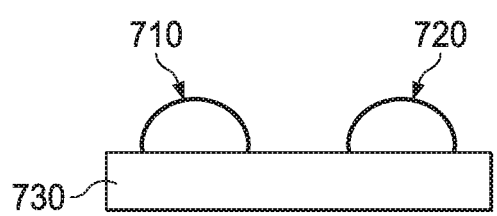

FIG. 7 illustrates a side view where multiple standoffs 710 and 720 are bonded to a given surface conductor 730. Such multiple standoff configurations may be employed to increase mechanical stability of the electrical device. Although, loop standoffs are shown in this example for a multiple standoff configuration, other standoff configurations are possible such as illustrated and described herein.

Figure 8:
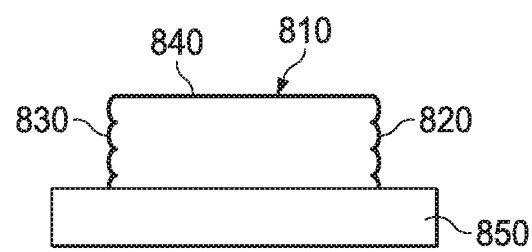

FIG. 8 illustrates a side view of a standoff connector 810 that is formed from a pair of legs configured to implement an electrical function. The standoff connector 810 includes legs 820 and 830 that are connected via an intermediate portion 840. Each of the legs 820 and 830 can be configured as loops having respective ends that each are bonded to a surface conductor 850. In this example, each of the legs 820 and 830 includes one or more coils that are formed during the wire bonding process for example. The respective coils can be configured as inductors, for example, where the inductance is determined by the number of loops fabricated in the respective legs 820 and 830, for example.

Figure 9:
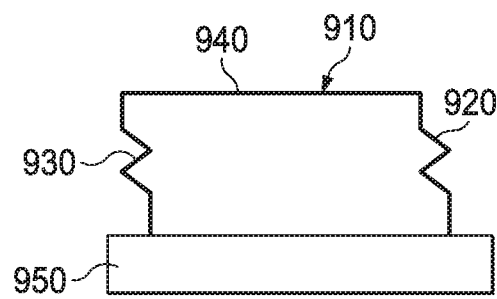

FIG. 9 illustrates a side view of a standoff connector 910 that is formed as from legs having a mechanical support function. The standoff connector 910 includes legs 920 and 930 that are connected via an intermediate portion 940. Each of the legs 920 and 930 are bonded to a surface conductor 950. In this examples, each the legs 920 and 930 includes one or more spring bends that are formed during the wire bonding process for example. The spring bends can form a spring, for example, where the spring constant is determined by the number of spring bends, thickness and wire material fabricated in the respective legs 920 and 930, for example.

Figure 10:
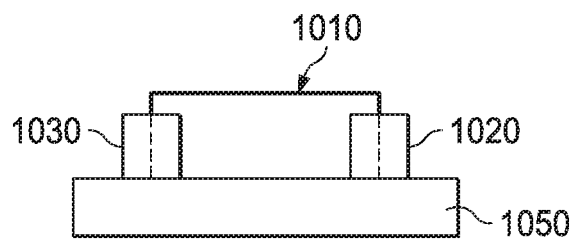

FIG. 10 illustrates a side view of a standoff connector 1010 having legs that are encapsulated in a molding material (e.g., electrical insulating material) such as shown at 1020 and 1030. The molding material 1020 can be fabricated as a process step after the respective legs have been bonded to the surface conductor. Such molding can be utilized to increase the mechanical stability of the legs, for example.

Figure 11:
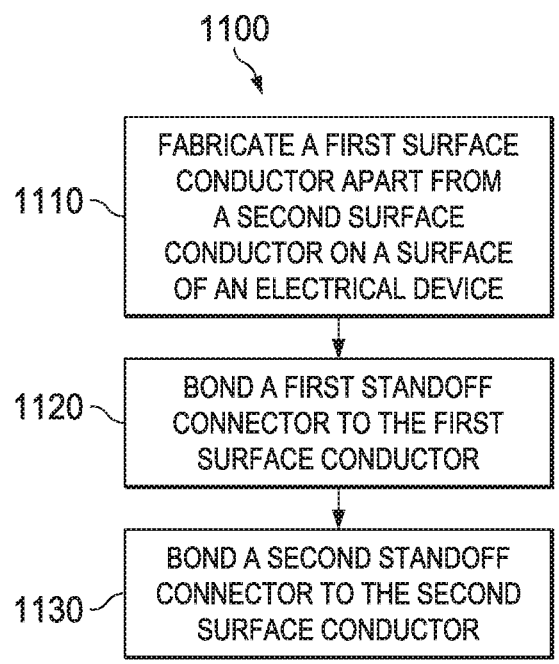
FIG. 11 illustrates an example method to bond standoff connectors to surface conductors of an electrical device.

In view of the foregoing structural and functional features described above, an example method will be better appreciated with reference to FIG. 11. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed to manufacture and integrated circuit, for example.

FIG. 11 illustrates an example method 1100 to bond standoff connectors to surface conductors of an electrical device. At 1110, the method 1100 includes fabricating a first surface conductor apart from a second surface conductor on a surface of an electrical device to provide circuit contacts to the device. At 1120, the method 1100 includes bonding a first standoff connector to the first surface conductor. The first standoff connector includes a leg having a proximal end bonded to the first surface conductor. The leg of the first standoff connector extends outwardly from the first surface conductor to a bend that is spaced apart from the surface of the electrical device. At 1130, the method 1100 includes bonding a second standoff connector to the second surface conductor. The second standoff connector includes a leg having a proximal end bonded to the second surface conductor. The leg of the second standoff connector extends outwardly from the second surface conductor to a bend that is spaced apart from the surface of the electrical device.

Although not shown, the method 1100 can also include wire-bonding or ribbon-bonding the first and second standoff connectors to the first and second surface conductors respectively. This can include forming the legs as an electrical or a mechanical spring component, for example. The method 1100 can also include fabricating a molding material to encapsulate the legs. The method 100 can also include connecting the bend of the first and second standoff connector respectively to an intermediate portion of the first and second standoff. This includes connecting the intermediate portion to at least one other bend and connecting the at least one other bend to at least one other leg having a proximal end bonded to at least one other portion of the first and second surface conductor respectively.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An apparatus, comprising:
   an electrical device having a surface, the electrical device comprising a first surface conductor spaced apart from a second surface conductor on the surface to provide circuit contacts to the electrical device;
   a first standoff connector bonded to the first surface conductor, the first standoff connector comprising:
      a leg having a proximal end wire or ribbon bonded to the first surface conductor, the leg of the first standoff connector extending outwardly from the first surface conductor to a first right angle bend that is spaced apart from the surface of the electrical device; and
   a second standoff connector bonded to the second surface conductor, the second standoff connector comprising:
      a leg having a proximal end wire or ribbon bonded to the second surface conductor, the leg of the second standoff connector extending outwardly from the second surface conductor to a second right angle bend that is spaced apart from the surface of the electrical device.

2. The apparatus of claim 1, further comprising a molding material to encapsulate the legs.

3. A method, comprising:
fabricating a first surface conductor apart from a second surface conductor on a surface of an electrical device to provide circuit contacts to the electrical device;
bonding a first standoff connector to the first surface conductor, the first standoff connector comprising:
a leg having a proximal end wire or ribbon bonded to the first surface conductor, the leg of the first standoff connector extending outwardly from the first surface conductor to a first right angle bend that is spaced apart from the surface of the electrical device; and
bonding a second standoff connector to the second surface conductor, the second standoff connector comprising:
a leg having a proximal end wire or ribbon bonded to the second surface conductor, the leg of the second standoff connector extending outwardly from the second surface conductor to a second right angle bend that is spaced apart from the surface of the electrical device.

4. The method of claim 3, further comprising encapsulating the legs with a molding material.

5. An apparatus, comprising:
an electrical device having a surface, the electrical device comprising a first surface conductor spaced apart from a second surface conductor on the surface to provide circuit contacts to the electrical device;
a first standoff connector bonded to the first surface conductor, the first standoff connector comprising:
a leg having a proximal end wire or ribbon bonded to the first surface conductor, the leg of the first standoff connector extending outwardly from the first surface conductor; and
a second standoff connector bonded to the second surface conductor, the second standoff connector comprising:
a leg having a proximal end wire or ribbon bonded to the second surface conductor, the leg of the second standoff connector extending outwardly from the second surface conductor;
wherein a bend of the first standoff connector is connected to an intermediate portion of the first standoff connector which connects to at least one other bend, the at least one other bend connected to at least one other leg having a proximal end bonded to at least one other portion of the first surface conductor; and
wherein a bend of the second standoff connector is connected to an intermediate portion of the second standoff connector which connects to at least one other bend, the at least one other bend connected to at least one other leg having a proximal end bonded to at least one other portion of the second surface conductor.

6. The apparatus of claim 5, wherein the first standoff connector and the second standoff connector are bonded at opposite ends or diagonal ends of the surface of the electrical device.

7. The apparatus of claim 5, wherein the first standoff connector and second standoff connectors include copper or gold, palladium-coated copper or gold, or nickel-coated copper or gold.

8. The apparatus of claim 5, further comprising a molding material to encapsulate the legs.

9. The apparatus of claim 5, further comprising:
a printed circuit board (PCB), the electrical device coupled to the PCB via the first and second standoff connector, the electrical device mounted at a mounting distance from the PCB defined by the distance that the legs extend outwardly from the first and second standoff connectors.

10. The apparatus of claim 9, wherein the mounting distance provides a spatial volume underneath the electrical device to mount at least one other electric device onto the PCB.

11. The apparatus of claim 9, wherein the first standoff connector and the second standoff connector are bonded at opposite ends or diagonal ends of the surface of the electrical device.

12. The apparatus of claim 9, wherein the first and second standoff connectors include copper or gold, palladium-coated copper or gold, or nickel-coated copper or gold.

13. The apparatus of claim 9, further comprising a molding material to encapsulate the legs.

14. The apparatus of claim 12, wherein the first standoff connector and the second standoff connector are bonded at opposite ends or diagonal ends of the surface of the electrical device.

15. The apparatus of claim 9, wherein each of the first and second standoff connectors is formed as a hollow loop that extends outwardly from the first and second surface conductors respectively.

16. The apparatus of claim 9, further including at least one additional electrical device mounted onto the PCB in a mounting area beneath the electrical device.

17. The apparatus of claim 9, further comprising coupling the electrical device to a printed circuit board (PCB) via the first and second standoff connector, the electrical device spaced at a mounting distance from the PCB by the distance that the legs extend outwardly from the first and second standoff connectors.

18. The apparatus of claim 9, wherein the first standoff connector and second standoff connector are formed as rectangles or squares.

19. The apparatus of claim 9, wherein the first standoff connector and second standoff connector are formed as an arcuate loops.

20. The method of claim apparatus of claim 9, wherein the first standoff connector is formed from legs fabricated at inclines angles with respect to a surface of the first surface conductor and the second standoff connector is formed from legs fabricated at inclines angles with respect to a surface of the first surface conductor.

21. A method, comprising:
fabricating a first surface conductor apart from a second surface conductor on a surface of an electrical device to provide circuit contacts to the electrical device;
bonding a first standoff connector to the first surface conductor, the first standoff connector comprising:
a leg having a proximal end wire or ribbon bonded to the first surface conductor, the leg of the first standoff connector extending outwardly from the first surface conductor;
bonding a second standoff connector to the second surface conductor, the second standoff connector comprising:
a leg having a proximal end wire or ribbon bonded to the second surface conductor, the leg of the second standoff connector extending outwardly from the second surface conductor;
wherein a bend of the first standoff connector is connected to an intermediate portion of the first standoff connector which connects to at least one other bend, the at least one other bend connected to at least one other leg having a proximal end bonded to at least one other portion of the first surface conductor; and
wherein a bend of the second standoff connector is connected to an intermediate portion of the second standoff connector which connects to at least one other bend, the at least one other bend connected to at least one other leg having a proximal end bonded to at least one other portion of the second surface conductor.

22. The method of claim 21, further comprising encapsulating the legs with a molding material.

23. The method of claim 21, further comprising at least one additional electrical device mounted onto the PCB in a mounting area beneath the electrical device.

24. The method of claim 21, further comprising coupling the electrical device to a printed circuit board (PCB) via the first and second standoff connector, the electrical device spaced at a mounting distance from the PCB by the distance that the legs extend outwardly from the first and second standoff connectors.

25. The method of claim 21, wherein the first standoff connector and second standoff connector are formed as rectangles or squares.

26. The method of claim 21, wherein the first standoff connector and second standoff connector are formed as an arcuate loops.

27. The method of claim 21, wherein the first standoff connector is formed from legs fabricated at inclines angles with respect to a surface of the first surface conductor and the second standoff connector is formed from legs fabricated at inclines angles with respect to a surface of the first surface conductor.

* * * * *